(12) United States Patent
Wang

(10) Patent No.: US 8,686,784 B2
(45) Date of Patent: Apr. 1, 2014

(54) VOLTAGE LEVEL SHIFTER

(75) Inventor: Meng Wang, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/605,985

(22) Filed: Sep. 6, 2012

(65) Prior Publication Data

US 2013/0154713 A1    Jun. 20, 2013

(30) Foreign Application Priority Data

Dec. 16, 2011  (CN) .......................... 2011 1 0462926

(51) Int. Cl.
*H03L 5/00* (2006.01)

(52) U.S. Cl.
USPC ........................................................ 327/333

(58) Field of Classification Search
USPC ........................................................ 327/333
See application file for complete search history.

(56) References Cited

U.S. PATENT DOCUMENTS

| | | | |
|---|---|---|---|
| 4,486,670 A | 12/1984 | Chan et al. | |
| 4,978,870 A | 12/1990 | Chen et al. | |
| 5,666,070 A | 9/1997 | Merritt et al. | |
| 5,821,800 A | 10/1998 | Le et al. | |
| 6,222,384 B1 | 4/2001 | Kim | |
| 6,954,100 B2 | 10/2005 | Dharne | |
| 7,002,371 B2 | 2/2006 | Kase | |
| 7,009,424 B2 | 3/2006 | Khan | |
| 7,061,299 B2 | 6/2006 | Khan | |
| 7,382,158 B2 | 6/2008 | Kimura | |
| 7,397,297 B2 | 7/2008 | Kimura | |
| 7,443,223 B2 | 10/2008 | Bajkowski | |
| 7,446,566 B1 | 11/2008 | Chrudimsky | |
| 7,501,876 B2 | 3/2009 | Kimura | |
| 7,629,830 B1 * | 12/2009 | Rubin | 327/333 |
| 7,683,668 B1 | 3/2010 | Thakur | |
| 7,777,522 B2 | 8/2010 | Yang | |
| 7,893,730 B2 | 2/2011 | Jung | |
| 8,134,400 B2 * | 3/2012 | Yamamoto | 327/333 |
| 2007/0176668 A1 | 8/2007 | Kimura | |
| 2008/0088341 A1 | 4/2008 | Kimura | |
| 2008/0164931 A1 | 7/2008 | Kimura | |

* cited by examiner

*Primary Examiner* — Lincoln Donovan
*Assistant Examiner* — Khareem E Almo
(74) *Attorney, Agent, or Firm* — Charles Bergere

(57) ABSTRACT

A level shifter includes a latch supplied at a first voltage, and first and second series connections of first and second switch elements and first and second biased elements in series with first and second branches of the latch respectively. Third and fourth switch elements are connected in parallel with the first and second series connections respectively. The input signal, at a voltage different from the first voltage, activates the third or fourth switch element during a transition period after a change of state of the input signal one way or the other to change the state of the latch, and deactivates the third or fourth switch element and activates the first or second switch element to maintain the state of the latch during a stabilization period following the transition period. The transition periods are shortened, reducing current consumption and transfer delay times.

5 Claims, 3 Drawing Sheets

VOLTAGE LEVEL SHIFTER

BACKGROUND OF THE INVENTION

The present invention is directed to digital electronic circuits and, more particularly, to a voltage level shifter.

A semiconductor device, such as an integrated circuit (IC) may operate using more than one power supply voltage. For example, an IC may have internal modules having different functions and using different power supply voltages. Further, the signal level at an input/output terminal connected to an external module may be determined for compatibility with the characteristics of the connected module and require a power supply voltage different from that for internal circuits. A level shifter (sometimes also referred to as a level translator) is a widely used circuit used to convert signal levels to a higher or lower voltage.

Two key parameters of a level shifter are its current and power consumption, and its transfer delay (the delay between a change in the input signal and a corresponding change in the output signal. The power supply voltage for a level shifter is high, often being the highest voltage in the IC, making low current consumption a particularly important parameter for low power consumption. Transfer delay is also important, especially in some gate driver applications that need a fast turning on time. These parameters tend to be conflicting and known level shifters represent a compromise between the two parameters. It is desirable to provide a level shifter with lower consumption current but also with higher transfer speed.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

DETAILED DESCRIPTION OF PREFERRED EMBODIMENTS OF THE INVENTION

Figures 1, 2:
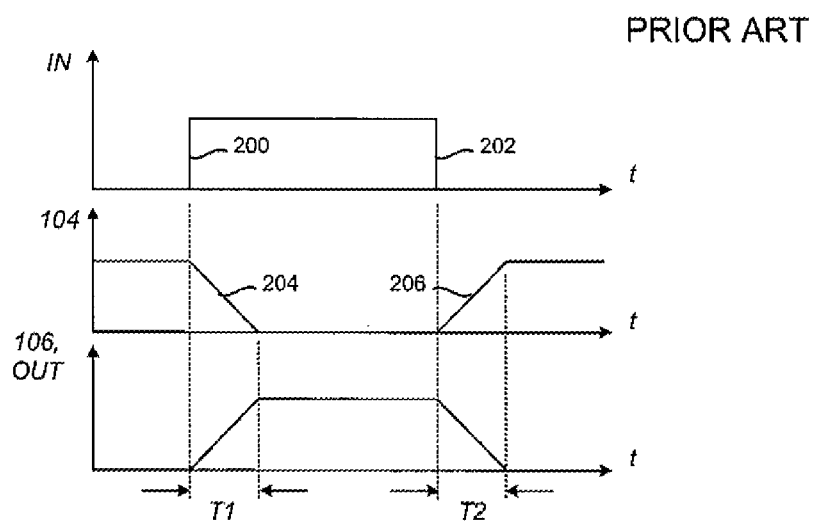
FIG. 1 is a schematic circuit diagram of a known level shifter.
FIG. 2 is a timing chart of signals appearing in operation of the level shifter of FIG. 1.

The examples of level shifters described below and shown in the drawings are shown with positive supply voltages relative to ground and corresponding polarities of semiconductor devices. It will be appreciated that the level shifters may have negative supply voltages and/or supply relative to a voltage other than ground. Also, the level shifters described below and shown in the drawings provide an output signal at a voltage greater than the input signal. Moreover the level shifters may be adapted to provide output signals at more than one voltage. Additionally, the level shifters are shown with a single output but it will be appreciated that the level shifters may have complementary outputs.

FIG. 1 shows a known level shifter 100 having p-type complementary metal-oxide semiconductor (CMOS) transistors M0 and M1 whose sources are connected to a positive supply rail 102 at a voltage $V_{DD1}$ and whose drains are connected to nodes 104 and 106 respectively. The CMOS transistors M0 and M1 are cross-coupled by connection of their gates to the nodes 106 and 104 respectively, their gates thus being connected to the drain of the other of the CMOS transistors M0 and M1. The source-drain paths of the cross-coupled CMOS transistors M0 and M1 form first and second branches of a latch 108.

The level shifter 100 also has first and second series connections between the nodes 104 and 106 respectively and ground. The first and second series connections include first and second biased n-type CMOS transistors M2 and M3 and first and second n-type switch CMOS transistors M4 and M5 in series with the first and second branches respectively. The drains of the biased CMOS transistors M2 and M3 are connected to the nodes 104 and 106 and their sources are connected to nodes 110 and 112. The drains of the transistors M4 and M5 are connected to the nodes 110 and 112 and their sources are connected to ground. The gates of the transistors M2 and M3 are biased at a voltage $V_{DD2}$, which is smaller than the supply voltage $V_{DD1}$. The gate of the switch transistor M4 is connected to a terminal 114 to receive an input signal IN and the gate of the switch transistor M5 is connected to the terminal 114 through an inverter 116 to receive an inverted signal $IN_B$. The voltage of the input signal IN is less than the voltage $V_{DD2}$ when asserted and equal to 0V (ground potential) when de-asserted, in this example, although it will be appreciated that other voltages are possible. The output signal OUT is taken from the node 106 and its level varies between $V_{DD1}$ when asserted, and 0V when de-asserted. In one example of the level shifter 100, the voltage of the input signal IN is 3V when asserted, the voltage $V_{DD2}$ is 9V and the voltage $V_{DD1}$ is 40V.

In operation, if the latch 108 is initially in a state with the transistor M0 conducting, the node 104 is at the supply voltage $V_{DD1}$. The gate of the transistor M1 is at the same voltage $V_{DD1}$ and the transistor M1 is OFF. When the input signal IN changes state from low to high, as shown in FIG. 2 at 200, the switch transistor M4 is turned ON and the switch transistor M5 is turned OFF. The switch transistor M4 pulls down to ground the voltage of the node 104 through the transistor M2, which is conducting in its linear range. The transistor M1 is turned ON, pulling up the voltage of the node 106 and of the output signal OUT to the voltage $V_{DD1}$. The voltage $V_{DD1}$ at the node 106 turns the transistor M0 OFF, reinforcing the change of state of the latch 108. When the input signal IN subsequently changes state from high to low, as shown in FIG. 2 at 202, the state of the latch 108 reverses, the transistor M0 being turned ON, and the transistor M1 being turned OFF.

The biased transistors M2 and M3 share the switching voltages with the switch transistors M4 and M5. When the switching transistor M4 or M5 is OFF the bias voltage at the gate of the transistor M2 or M3 prevents the voltage at the nodes 110 or 112 from rising above $V_{DD2}$-$V_{TH}$, where $V_{TH}$ is the threshold voltage of the transistors M2 and M3, enabling the use of a higher supply voltage $V_{DD1}$ and the output voltage OUT than the breakdown voltages of the switch transistors M4 and M5 would otherwise permit. However, when the switch transistor M4 or M5 is turned ON at 200 or 202, the transistor M0 or M1 is still conducting with a low resistance $R_{DSON}$ and pulling the node 104 or 106 up to the voltage $V_{DD1}$. The transistors M2 and M3 are working in their linear range, so that the changes of voltage at the nodes 104 and 106 and the gates of the transistors M0 and M1 occur progressively, during periods of time T1 and T2, as shown at 204 and 206 the voltage of the node 104 or 106 being pulled down slowly.

During the period of time T1, the transistor M0 has not yet been turned OFF, so a substantial current can flow through the transistor M0 and the series connection of the transistors M2 and M4 from the voltage supply 102 to ground, increasing the current and power consumption of the level shifter 100. Similarly, during the period of time T2, the transistor M1 has not yet been turned OFF, so a substantial current can flow through the transistor M1 and the series connection of the transistors M3 and M5 from the voltage supply 102 to ground. The periods of time T1 and T2 also prolong the transfer delay of the level shifter 100 between a change in the input signal IN and a corresponding change in the output signal OUT. Increasing the size of the transistors M0 to M5 can reduce the transfer delay but will increase the current $I_0$ during the periods of time T1 and T2, increasing the power consumption of the level shifter 100.

Figure 3:
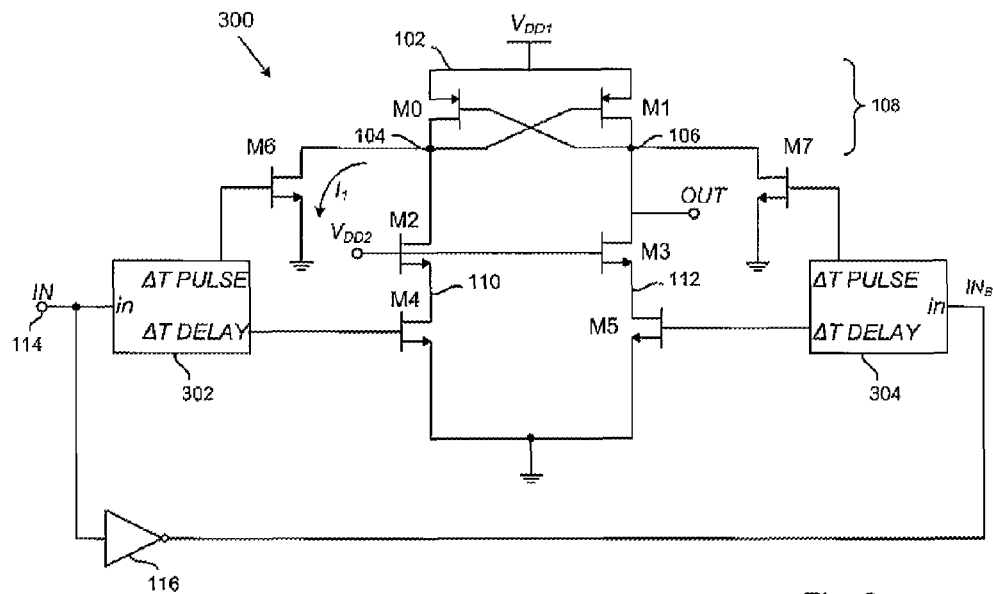
FIG. 3 is a schematic circuit diagram of a level shifter in accordance with one embodiment of the invention, given by way of example.

FIG. 3 illustrates a level shifter 300 in accordance with an embodiment of the invention, given by way of example. The level shifter 300 comprises a latch 108, like the latch 108 of the known level shifter 100 (FIG. 1), supplied at a first voltage $V_{DD1}$ and having first and second branches. The level shifter 300 also comprises first and second series connections of first and second switch elements M4 and M5 in series with the first and second branches respectively and an output 106 connected to at least one of the branches, like the transistors M2-M5 of the known level shifter 100. However, the level shifter 300 also has third and fourth switch elements M6 and M7 connected in parallel with the first and second series connections respectively.

The level shifter 300 also includes controller modules 302 and 304 that receive an input signal IN at a voltage different from the first voltage $V_{DD1}$ for activating the third switch element M6 during a transition period $\Delta T$ after assertion of the input signal IN to change the state of the latch 108, and for deactivating the third switch element M6 and activating the first switch element M4 to maintain the state of the latch 108 during a stabilization period T3 following the transition period $\Delta T$. The controller modules 302, 304 also activate the fourth switch element M7 during an inverse transition period $\Delta T$ after de-assertion of the input signal IN to change the state of the latch 108, and deactivates the fourth switch element M7 and activates the second switch element M5 to maintain the state of the latch 108 during a stabilization period T4 following the inverse transition period. The transition periods $\Delta T$ are shorter than the transition periods of time T1 and T2 of the level shifter 100.

In this example, the first and second series connections of the level shifter 300 include first and second biased elements M2 and M3 connected in series between the first and second switch elements M4 and M5 and the first and second branches respectively. The first and second biased elements M2 and M3 are biased by a second voltage ($V_{DD2}$) that is smaller than the first voltage ($V_{DD1}$). In this example, the elements M0 to M7 are respective transistors having signal paths connected as described above and gate electrodes of the transistors receive voltages from the controller 302, 304 to control the signal paths.

In more detail, in the level shifter 300, the first and second branches of the latch 108 include the source-drain signal paths of p-type transistors M0 and M1 whose sources are connected to a positive supply rail 102 at a voltage $V_{DD1}$ and whose drains are connected to nodes 104 and 106 respectively. The CMOS transistors M0 and M1 are cross-coupled by connection of their gates to the nodes 106 and 104 respectively, their gates thus being connected to the drain of the other of the CMOS transistors M0 and M1.

The first and second series connections in the level shifter 300 include biased CMOS n-type transistors M2 and M3, whose drains are connected to the nodes 104 and 106, and whose sources are connected to nodes 110 and 112, and n-type CMOS switch transistors M4 and M5 whose drains are connected to the nodes 110 and 112 and whose sources are connected to ground. The gates of the transistors M2 and M3 are biased at a voltage $V_{DD2}$ that is less than the supply voltage $V_{DD1}$.

The level shifter 300 also has third and fourth n-type CMOS switch transistors M6 and M7 whose drain-source signal paths are connected in parallel with the first and second series connections respectively. The drains of the third and fourth switch transistors M6 and M7 are connected to the nodes 104 and 106 respectively and their sources are connected directly to ground, without passing through elements such as the biased transistors M2 or M3.

The level shifter 300 includes controller modules 302 and 304. An input of the controller module 302 is connected to a terminal 114 to receive an input signal IN and an input of the controller module 304 is connected to the terminal 114 through an inverter 116 to receive an inverted input signal $IN_B$. The controller modules 302 and 304 provide control signals $\Delta$TPULSE to the gates of the switch transistors M6 and M7 and control signals $\Delta$TDELAY to the gates of the switch transistors M4 and M5 respectively. The voltages of the input signal IN and $IN_B$ and of the control signals $\Delta$TPULSE and $\Delta$TDELAY are less than the voltage $V_{DD2}$ when asserted and are equal to 0V (ground potential) when de-asserted in this example, although it will be appreciated that other voltages are possible. The output signal OUT is taken from the node 106 and its level varies between $V_{DD1}$ when asserted, which is greater than the voltage of the input signal IN, and 0V when de-asserted. It is also possible to provide a complementary output signal from the node 104. In one example of the level shifter 300, the voltage of the input signal IN is 3V when asserted, the voltage $V_{DD2}$ is 9V and the voltage $V_{DD1}$ is 40V.

Figure 4:
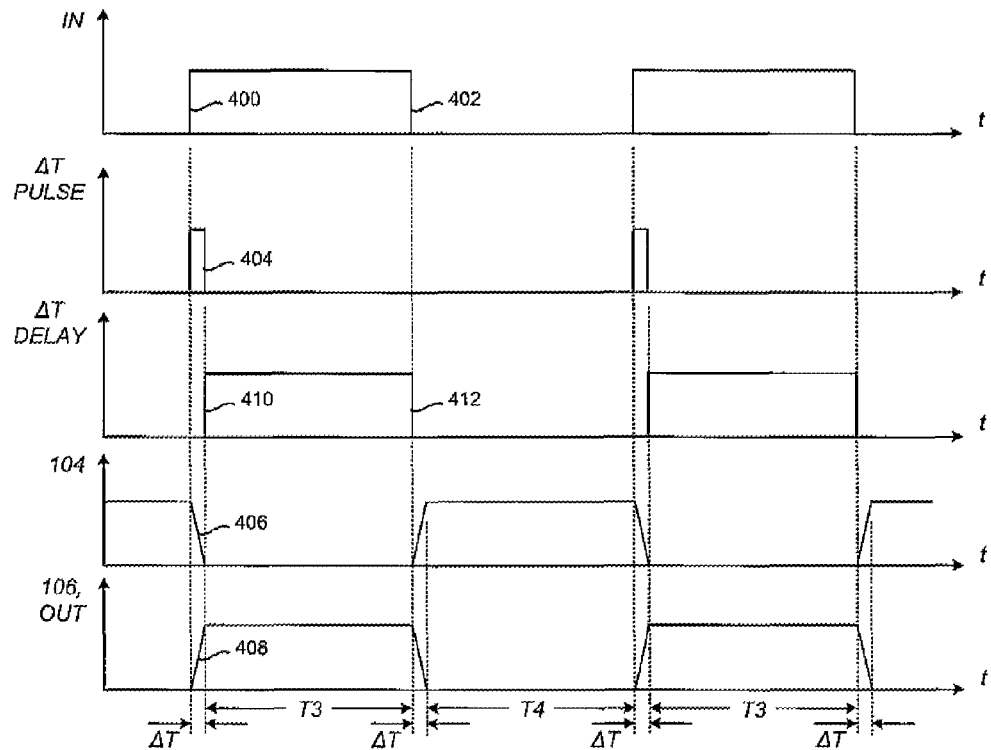
FIG. 4 is a timing chart of signals appearing in operation of the level shifter of FIG. 3.

In operation, if the latch 108 of the level shifter 300 is initially in a state with the transistor M0 conducting, the node 104 is at the supply voltage $V_{DD1}$. The gate of the transistor M1 is at the same voltage $V_{DD1}$ and the transistor M1 is OFF. When the input signal IN is asserted and changes state from low to high, as shown in FIG. 4 at 400, the controller module 302 asserts the control signal $\Delta$TPULSE at the gate of the switch transistor M6 as shown at 404 and turns the switch transistor M6 ON for a transition period of duration $\Delta T$. The controller module 304 maintains the control signals $\Delta$TPULSE and $\Delta$TDELAY de-asserted at the gates of the switch transistor M5 and the switch transistor M7, which are OFF. The switch transistor M6 pulls the voltage of the node 104 directly down to ground as shown at 406. The transistor M1 is turned ON, pulling up the voltage of the node 106 and of the output signal OUT to the voltage $V_{DD1}$ as shown at 408. The voltage $V_{DD1}$ at the node 106 turns the transistor M0 OFF, reinforcing the change of state of the latch 108. The duration $\Delta T$ of assertion of the control signal $\Delta$TPULSE is chosen to be as short as is compatible with ensuring the change of state of the latch 108.

At the end of the transition period $\Delta T$, the controller module 302 de-asserts the control signal $\Delta$TPULSE and asserts the control signal $\Delta$TDELAY at the gate of the switch transistor M4 for a stabilization period of duration T3. The switch transistor M6 turns OFF and remains OFF until the controller module 302 asserts the control signal $\Delta$TPULSE again. The switch transistor M4 turns ON and remains ON for the duration T3 of the stabilization period but does not have to sink a current such as $I_0$ from the transistor M0, which is already turned OFF, unlike the level shifter 100. The stabilization period is defined by the cycle time of the input signal IN and the controller module 302 de-asserts the control signal ΔTDELAY at the falling edge 402 of the input signal IN, as shown at 412.

At the falling edge 402 of the input signal IN, when the input signal IN is de-asserted and changes state from high to low and the output $IN_B$ of the inverter 116 changes state from low to high, the controller module 304 asserts the control signal ΔTPULSE at the gate of the switch transistor M7 and turns the switch transistor M7 ON for an inverse transition period of duration ΔT. The controller module 302 maintains the control signals ΔTPULSE and ΔTDELAY de-asserted at the gates of the switch transistor M4 and the switch transistor M6, which are OFF. The switch transistor M7 pulls the voltage of the node 106 and of the output signal OUT directly down to ground. The transistor M0 is turned ON, pulling up the voltage of the node 104 to the voltage $V_{DD1}$. The voltage $V_{DD1}$ at the node 104 turns the transistor M1 OFF, reinforcing the change of state of the latch 108.

At the end of the transition period ΔT, the controller module 304 de-asserts the control signal ΔTPULSE at the gate of the switch transistor M7 and asserts the control signal ΔTDELAY at the gate of the switch transistor M5 for a stabilization period of duration T4. The switch transistor M7 turns OFF and remains OFF until the controller module 304 asserts the control signal ΔTPULSE again. The switch transistor M5 turns ON and remains ON for the duration T4 of the stabilization period.

During the transition period ΔT, at the rising or falling edge 400 or 402 of the input signal IN, the transistor M0 or M1 has not yet been turned OFF, so that a substantial current $I_1$ can flow through the transistor M0 or M1 and the switch transistor M6 or M7, greater than the current such as $I_0$ of the level shifter 100. However, the duration of the transition period ΔT can be made very much shorter than the duration T1 of change of state of the latch 108 in the level shifter 100, since the switch transistor M6 or M7 pulls the voltage of the node 104 or 106 rapidly down to ground without the intervening resistance of the biased transistor M2 or M3. Accordingly, the total current consumption of the level shifter 300 during a complete cycle of the input signal IN can be reduced compared to the level shifter 100. The same reduction of the transition period ΔT enables a reduction of the transfer delay of the level shifter 300 compared to the level shifter 100. In an example of implementation of the level shifters 100 and 300 having similar components except for the switch transistors M6 and M7 and the controllers 302 and 304, the transfer delay of the level shifter 300 was reduced to 10% of the transfer delay of the level shifter 100, while the current consumption of the level shifter 300 was reduced to 50% of the current consumption of the level shifter 100.

Figure 5:
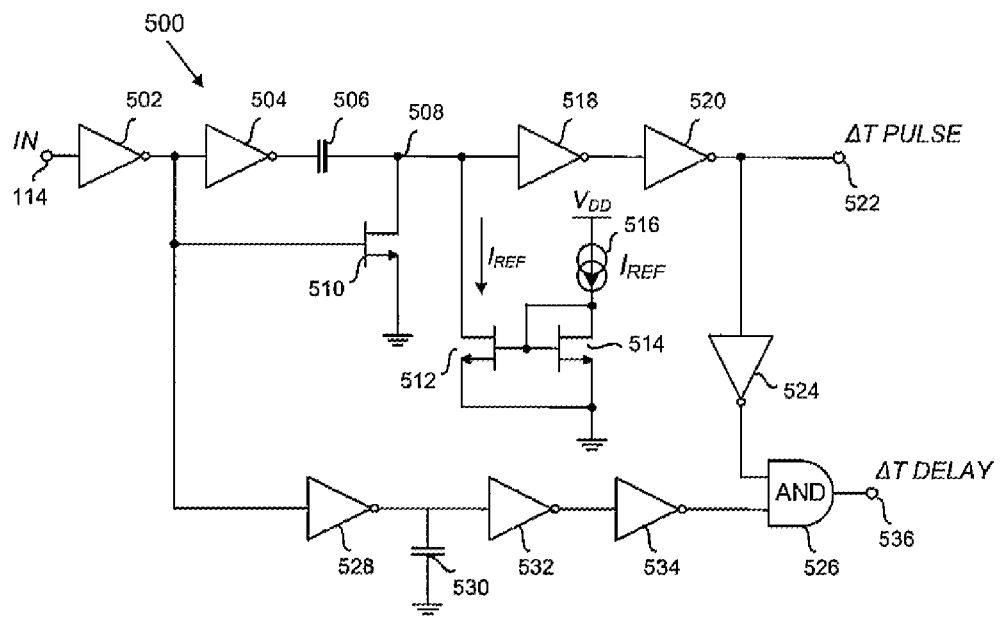
FIG. 5 is a schematic circuit diagram of a controller in the level shifter of FIG. 3.

FIG. 5 shows an example 500 of an embodiment of the controller module 302. The controller module 304 may have a similar structure, except for receiving the inverted input signal $IN_B$ instead of the input signal IN at its input. The controller module 500 has an inverter 502 whose input is connected to the input terminal 114. The inverter 502 has an output connected to an input of an inverter 504. A capacitor 506 is connected between an output of the inverter 504 and a node 508. An n-type switch transistor 510 has a drain connected to the node 508, a source connected to ground and a gate connected to the output of the inverter 502. A pair of n-type switch transistors 512 and 514 is connected in current mirror configuration with a constant current source 516, so that a drain-source path of the transistor 512 sinks a constant current $I_{REF}$ to ground from the node 508 when the voltage at the node 508 is high. An inverter 518 has an input connected to the node 508 and an inverter 520 has an input connected to an output of the inverter 518, the inverters 518 and 520 acting as pulse shapers. An output of the inverter 520 is connected to an output terminal 522 and provides the control signal ΔTPULSE. The output of the inverter 520 is connected to an input of an inverter 524 and an input of an AND gate 526 is connected to an output of the inverter 524.

An inverter 528 has an input connected to the output of the inverter 502. A capacitor 530 is connected between an output of the inverter 502 and ground and generates a timing delay between the signals IN and ΔTDELAY for synchronization. An inverter 532 has an input connected to the output of the inverter 528 and an inverter 534 has an input connected to an output of the inverter 532, the inverters 532 and 534 acting as pulse shapers. An output of the inverter 534 is connected to another input of the AND gate 526. An output of the AND gate 526 is connected to an output terminal 536 and provides the control signal ΔTDELAY.

In operation, when the input signal IN is de-asserted, the output of the inverter 502 is asserted, the output of the inverter 504 is de-asserted, the switch transistor 510 is ON and the capacitor is discharged to ground. The voltage at the node 508 is low and the control signal ΔTPULSE from the inverters 518 and 520 at the output terminal 522 is de-asserted. The output of the inverter 524 is asserted. The outputs of the inverters 528 and 534 are de-asserted, and the control signal ΔTDELAY at the output of the AND gate 536 is de-asserted.

At the rising edge 400, when the input signal IN is asserted, the output of the inverter 502 is de-asserted, the output of the inverter 504 is asserted, the switch transistor 510 is turned OFF and the voltages at both terminals of the capacitor are high. The voltage at the node 508 is high and the control signal ΔTPULSE from the inverters 518 and 520 at the output terminal 522 is asserted. The output of the inverter 524 is de-asserted. The outputs of the inverters 528 and 534 are asserted, but the control signal ΔTDELAY at the output of the AND gate 536 is de-asserted by the de-asserted output of the inverter 524. The transistor 512 draws current $I_{REF}$ from the node 508 and the capacitor 506, pulling the voltage of the node 508 progressively down towards ground until the control signal ΔTPULSE from the inverters 518 and 520 at the output terminal 522 is de-asserted. The output of the inverter 524 is asserted. The outputs of the inverters 528 and 534 are still asserted, and the control signal ΔTDELAY at the output of the AND gate 536 is asserted.

At the falling edge 402, when the input signal IN is de-asserted, the output of the inverter 502 is asserted, the output of the inverter 504 is de-asserted, the switch transistor 510 is turned ON and the capacitor is discharged to ground. The voltage at the node 508 is low and the control signal ΔTPULSE from the inverters 518 and 520 at the output terminal 522 is de-asserted. The output of the inverter 524 is asserted. The outputs of the inverters 528 and 534 are de-asserted, and the control signal ΔTDELAY at the output of the AND gate 536 is de-asserted.

Figure 6:
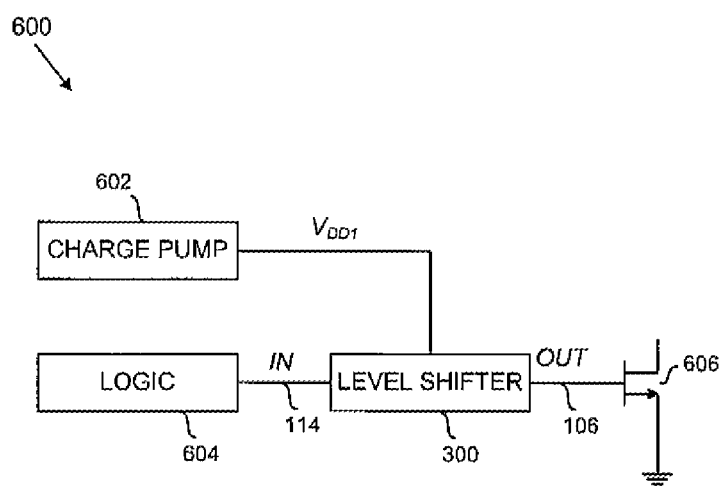
FIG. 6 is a schematic block diagram of a gate driver including the level shifter of FIG. 3, given by way of example.

FIG. 6 illustrates an example of a high voltage gate driver 600 including the level shifter 300. The gate driver is powered by a charge pump 602 at the voltage $V_{DD1}$. A logic circuit 604 applies to the input 114 of the level shifter 300 the input signal IN varying between ground and the voltage $V_{DD2}$. The output 106 of the level shifter 300 provides a drive voltage for the gate of a high voltage metal-oxide field-effect ('MOSFET') power transistor 606. The current consumption of the level shifter affects the voltage $T_{DD1}$ that the charge pump 602 supplies and hence the ON resistance $R_{DSON}$ of the MOSFET 606. The impact of the current consumption of the level shifter 300 on the ON resistance $R_{DSON}$ of the MOSFET 606 is considerably less than the impact of the level shifter 100 would be, while the transfer delay is faster.

In the foregoing specification, the invention has been described with reference to specific examples of embodiments of the invention. It will, however, be evident that various modifications and changes may be made therein without departing from the broader spirit and scope of the invention as set forth in the appended claims.

The connections discussed may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed. Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The terms "assert" or "set" and "negate" (or "de-assert" or "clear") are used when referring to the rendering of a signal, status bit, or similar element into its logically true or logically false state, respectively. If the logically true state is a logic level one, the logically false state is a logic level zero, and if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Similarly, any arrangement of components to achieve the same functionality is effectively "associated" such that the desired functionality is achieved. Hence, any two components combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

In the claims, the words 'comprising' and 'having' do not exclude the presence of other elements or steps then those listed in a claim. The terms "a" or "an," mean one or more than one. Also, the use of introductory phrases such as "at least one" and "one or more" should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between elements and thus, these terms are not necessarily intended to indicate temporal or other prioritization of such elements The fact that certain measures are recited in mutually different claims does not indicate that a combination of these measures cannot be used to advantage.

The invention claimed is:

1. A level shifter, comprising:
a latch supplied at a first voltage and having first and second branches;
first and second switch elements, respectively connected in series with said first and second branches;
an output connected to at least one of said branches;
third and fourth switch elements, respectively connected in parallel with said first and second series connections;
a controller receiving an input signal at a voltage different from said first voltage for activating said third switch element during a transition period after assertion of said input signal to change the state of said latch, and for deactivating said third switch element and activating said first switch element to maintain the state of said latch during a stabilization period following said transition period, for activating said fourth switch element during an inverse transition period after de-assertion of said input signal to change the state of said latch, and for deactivating said fourth switch element and activating said second switch element to maintain the state of said latch during a stabilization period following said inverse transition period, wherein said controller comprises a capacitive timing element defining a duration of said transition period and said inverse transition period;
a charge pump that supplies power to the level shifter; and
a power transistor having a gate electrode connected to said output of the level shifter, wherein said output applies a voltage to the gate electrode of the power transistor.

2. The level shifter of claim 1, further comprising first and second biased elements, respectively connected in series between said first and second switch elements and said first and second branches, wherein said first and second biased elements are biased by a second voltage that is less than said first voltage.

3. The level shifter of claim 1, wherein said controller comprises a gate element defining a start of said stabilization period as a function of ends of said transition period and said inverse transition period.

4. A level shifter, comprising:
- a latch having first and second branches supplied at a first voltage;
- a first series connection having a first biased element connected in series with said first branch and a first switch element connected in series with said first biased element;
- a second series connection of a second biased element connected in series with said second branch and a second switch element connected in series with said first biased element;
- wherein said first and second biased elements are biased by a second voltage that is less than said first voltage;
- an output connected to at least one of said branches;
- third and fourth switch elements, respectively connected in parallel with said first and second series connections; and
- a controller for receiving an input signal at a voltage different from said first voltage for activating said third switch element during a transition period after assertion of said input signal to change the state of said latch, and for deactivating said third switch element and activating said first switch element to maintain the state of said latch during a stabilization period following said transition period, for activating said fourth switch element during an inverse transition period after de-assertion of said input signal to change the state of said latch, and for deactivating said fourth switch element and activating said second switch element to maintain the state of said latch during a stabilization period following said inverse transition period, wherein said controller includes a capacitive timing element that defines a duration of said transition period and said inverse transition period, and
- wherein said controller includes a gate element that defines a start of said stabilization period as a function of ends of said transition period and said inverse transition period.

5. A level shifter, comprising:
- a latch having first and second branches supplied at a first voltage;
- a first series connection having a first biased transistor having a signal path that is connected in series with said first branch and a first switch transistor having a signal path that is connected in series between said signal path of said first biased transistor and ground;
- a second series connection of a second biased transistor having a signal path that is connected in series with said second branch and a second switch transistor having a signal path that is connected in series between said signal path of said first biased transistor and ground;
- wherein said first and second biased transistors have gate electrodes biased by a second voltage that is less than said first voltage;
- an output connected to at least one of said branches;
- third and fourth switch transistors having signal paths that are connected in parallel with said first and second series connections respectively; and
- a controller receiving an input signal at a voltage different from said first voltage for applying voltages to gate electrodes of said first, second, third and fourth switch transistors, activating said third switch transistor during a transition period after assertion of said input signal to change the state of said latch, deactivating said third switch transistor and activating said first switch transistor to maintain the state of said latch during a stabilization period following said transition period, activating said fourth switch transistor during an inverse transition period after de-assertion of said input signal to change the state of said latch, and deactivating said fourth switch transistor and activating said second switch transistor to maintain the state of said latch during a stabilization period following said inverse transition period, wherein said controller includes a capacitive timing transistor that defines a duration of said transition period and said inverse transition period, and
- wherein said controller includes a gate element defining a start of said stabilization period as a function of ends of said transition period and said inverse transition period.

* * * * *